(12) United States Patent
Lee et al.

(10) Patent No.: US 10,181,584 B2
(45) Date of Patent: Jan. 15, 2019

(54) DISPLAY DEVICE WITH A PLURALITY OF PHASE RETARDATION LAYERS

(71) Applicant: SAMSUNG DISPLAY CO., LTD., Yongin-si, Gyeonggi-do (KR)

(72) Inventors: Hee Young Lee, Suwon-si (KR); Suk Choi, Hwaseong-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/421,616

(22) Filed: Feb. 1, 2017

(65) Prior Publication Data
US 2017/0222188 A1  Aug. 3, 2017

(30) Foreign Application Priority Data

Feb. 3, 2016  (KR) ..................... 10-2016-0013359

(51) Int. Cl.
| | |
|---|---|
| H01L 29/08 | (2006.01) |
| H01L 21/00 | (2006.01) |
| H01L 51/52 | (2006.01) |
| G02B 5/30 | (2006.01) |
| H01L 51/56 | (2006.01) |
| H01L 51/50 | (2006.01) |
| H01L 27/32 | (2006.01) |

(52) U.S. Cl.
CPC ........ *H01L 51/5281* (2013.01); *G02B 5/3016* (2013.01); *H01L 51/5246* (2013.01); *H01L 51/5256* (2013.01); *H01L 51/56* (2013.01); *H01L 27/3244* (2013.01); *H01L 51/5088* (2013.01)

(58) Field of Classification Search
CPC ............. H01L 51/5281; H01L 51/5056; H01L 51/5088; H01L 51/5256; H01L 51/56; H01L 51/5246; G02B 5/3016; G02B 1/14
See application file for complete search history.

(56) References Cited

U.S. PATENT DOCUMENTS

| | | | | |
|---|---|---|---|---|
| 2008/0157655 | A1* | 7/2008 | Choi .................... | G02B 5/3083 313/504 |
| 2011/0175070 | A1* | 7/2011 | Kim .................... | H01L 51/0096 257/40 |
| 2013/0140587 | A1* | 6/2013 | Lim .................... | H01L 51/5281 257/88 |
| 2014/0347576 | A1* | 11/2014 | Jeong .................. | G02F 1/13338 349/12 |
| 2015/0144909 | A1* | 5/2015 | Byun .................. | H01L 51/5253 257/40 |
| 2015/0263311 | A1* | 9/2015 | Park .................... | H01L 51/5256 257/40 |

(Continued)

FOREIGN PATENT DOCUMENTS

| | | |
|---|---|---|
| KR | 10-1127363 | 3/2012 |
| KR | 1020120130473 | 12/2012 |

(Continued)

*Primary Examiner* — Alonzo Chambliss
(74) *Attorney, Agent, or Firm* — F. Chau & Associates, LLC

(57) ABSTRACT

A display device includes a light emitting diode disposed on a substrate, a thin film encapsulation layer covering the light emitting diode, a polarization layer disposed on the thin film encapsulation layer. The thin film encapsulation layer includes a plurality of phase retardation layers.

17 Claims, 12 Drawing Sheets

(56) References Cited

U.S. PATENT DOCUMENTS

2015/0378201 A1* 12/2015 Yim .................. G02F 1/1362
　　　　　　　　　　　　　　　　　　　　349/43
2016/0097881 A1* 4/2016 Yang ................. G02B 1/08
　　　　　　　　　　　　　　　　　　　　359/488.01
2017/0075171 A1* 3/2017 Lee .................. G02F 1/133711

FOREIGN PATENT DOCUMENTS

| KR | 1020130000310 | 1/2013 |
| KR | 1020140085131 | 7/2014 |

* cited by examiner

FIG. 3

| | Normal wavelength dispersion | | Inverse wavelength dispersion |
|---|---|---|---|
| | Posi a-plate | Nega a-plate | Posi c-plate |
| 1st phase retardation layer | λ/2 | λ/2 | |
| 2nd phase retardation layer | λ/4 | λ/4 | λ/4 |
| | 1st combination | 2nd combination | 3rd combination |
| | | Configuration | |

DISPLAY DEVICE WITH A PLURALITY OF PHASE RETARDATION LAYERS

CROSS-REFERENCE TO RELATED APPLICATION

This application claims priority under 35 U.S.C. § 119 to Korean Patent Application No. 10-2016-0013359, filed on Feb. 3, 2016 in the Korean Intellectual Property Office, the disclosure of which is incorporated by reference herein in its entirety.

TECHNICAL FIELD

The present invention relates to a display device.

DISCUSSION OF RELATED ART

Display devices such as an organic light emitting diode (OLED) display, a liquid crystal display (LCD), and a field emission display (FED) are in use. The OLED display is self-luminescent using an organic emission layer to generate excitons which emit light. The OLED device does not require a separate light source, unlike the LCD, so the OLED device is thin and lightweight.

SUMMARY

According to an exemplary embodiment of the present invention, a display device includes a light emitting diode disposed on a substrate, a thin film encapsulation layer covering the light emitting diode, a polarization layer disposed on the thin film encapsulation layer. The thin film encapsulation layer includes a plurality of phase retardation layers.

According to an exemplary embodiment of the present invention, a display device a light emitting diode disposed on a substrate, a polarization layer disposed on the light emitting diode, a first retardation layer interposed between the light emitting diode and the polarization layer, and a second retardation layer interposed between the first retardation layer and the polarization layer.

BRIEF DESCRIPTION OF DRAWINGS

These and other features of the present invention will become more apparent by describing in detail exemplary embodiments thereof with reference to the accompanying drawings of which:

FIG. 3 shows a configuration of a phase retardation layer according to several exemplary embodiments of the present invention;

DETAILED DESCRIPTION OF EXEMPLARY EMBODIMENTS

Figure 1:
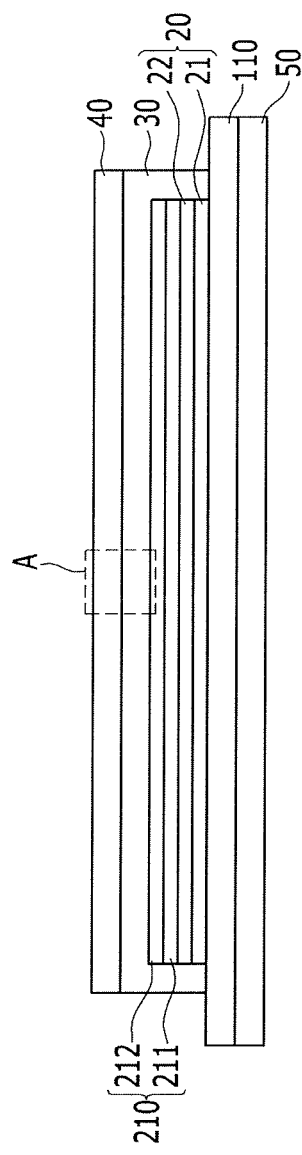
FIG. 1 shows a cross-sectional view of a display device according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

A display device according to an exemplary embodiment of the present invention will now be described with reference to an organic light emitting diode device with accompanying drawings.

FIG. 1 shows a cross-sectional view of a display device according to an exemplary embodiment of the present invention.

Referring to FIG. 1, the display device according to an exemplary embodiment of the present invention includes a substrate 110 and a display layer 20 disposed thereon. The display layer 20 is covered by a thin film encapsulation layer 30. A polarization layer 40 is disposed over the thin film encapsulation layer 30, and a passivation layer 50 is disposed below the substrate 110.

The substrate 110 may exemplarily be a flexible substrate made of a polymer film. For example, the substrate 110 may be made of a plastic such as polyimide, polyamide, polyethylene terephthalate, polyethylene naphthalate, polyethylene ether ketone, polycarbonate, polyethylene sulfonate, or polyarylate. The passivation layer 50 for protecting the flexible substrate is attached below the substrate 110 by an adhesive layer (not shown) such as a pressure sensitive adhesive (PSA) or an optically clear adhesive (OCA). The passivation layer 50 is a polymer film, and it may be made of a plastic such as polyethylene terephthalate, polyethylene naphthalate, polyethylene sulfide, or polyethylene. The present invention is not limited thereto. For example, the substrate 110 may be made of a rigid material such as glass. In this case, the passivation layer 50 may be omitted.

The display layer 20 disposed on the substrate 110 includes an emissive element layer 22. The emissive element layer 22 may include light emitting diodes. The display layer 20 may further include a driving element layer 21 to drive the light emitting diodes. For example, the driving element layer 21 may include signal lines (not shown) such as a gate line, a data line, or a driving voltage line, and transistors (not shown). The light emitting diode in the emissive element layer 22 may include a lower electrode (not shown), an upper electrode (not shown), and an emission layer (not shown) between the lower and upper electrodes. A detailed configuration of the display layer 20 will be described in a later portion of the specification.

A functional layer 210 is disposed on the display layer 20. The functional layer 210 includes a capping layer 211 and a blocking layer 212. The capping layer 211 is disposed on the emissive element layer 22, for example, just above an upper electrode of the light emitting diode, to protect the upper electrode. The blocking layer 212 is disposed just above the capping layer 211 and prevents a lower layer such as the emissive element layer 22 from being damaged by ions when the thin film encapsulation layer 30 is formed. For example, while the thin film encapsulation layer 30 is being formed in a fabrication process, the blocking layer 212 may protect the light emitting diodes from being damaged by reactive ions generated in the fabrication process of the thin film encapsulation layer 30. The capping layer 211 and the blocking layer 212 control a refractive index to control a characteristic of light coming out of the light emitting diode and resultantly increase photo-efficiency. For example, the capping layer 211 may be made of a high-refractive index organic material or a high-refractive index inorganic material such as ZnS, ZnSe, AgI, SiNx, or SiON, and the blocking layer 212 may be made of a low-refractive index inorganic material such as LiF, $MgF_2$, $AlF_3$, or NaF. In an exemplary embodiment, the blocking layer 212 may be omitted.

The thin film encapsulation layer 30 is disposed on the functional layer 210 to seal the display layer 20 and prevent permeation of external moisture or oxygen into the display layer 20. The thin film encapsulation layer 30 includes a plurality of layers. For example, the thin film encapsulation layer 30 may include at least one inorganic layer, at least one organic layer or a combination thereof. The thin film encapsulation layer 30 includes a plurality of phase retardation layers (not shown) serving as a polarization unit. A detailed configuration of the thin film encapsulation layer 30 will be described in a later portion of the specification.

The polarization layer 40 of the polarization unit is disposed on the thin film encapsulation layer 30. The polarization layer 40 may be a coated polarization layer that is formed by coating liquid crystal (e.g., lyotropic type of liquid crystal) on the thin film encapsulation layer 30 or coating a guest-host type of liquid crystal with which a dichroic dye is mixed. The polarization layer 40 may be attached to the thin film encapsulation layer 30 by an adhesive layer such as a PSA or an OCA. The polarization layer 40 may be made of an iodine-doped polyvinyl alcohol (PVA), and a passivation film (not shown) made of a material such as triacetyl cellulose (TAC) may be bonded to respective sides thereof. The polarization layer 40 may be a linear polarizer for transforming incident light into linearly polarized light. The polarization layer 40 serves as a polarization unit together with phase retardation layers in the thin film encapsulation layer 30. The polarization unit may reduce reflection of external light to increase a contrast ratio and visibility. The phase retardation layers of the polarization unit are not disposed on the thin film encapsulation layer 30 but are provided as layers of the thin film encapsulation layer 30, thereby reducing the thickness of the display device. Accordingly, the display device may be folded and bent with a lesser curvature.

The display device according to an exemplary embodiment of the present invention has been described. A display device according to an exemplary embodiment of the present invention will now be described with reference to a thin film encapsulation layer.

Figure 2:
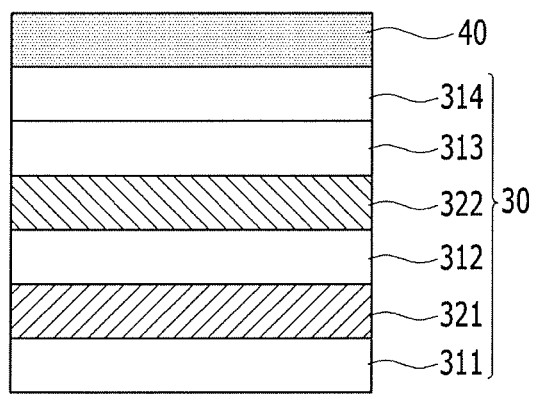
FIG. 2 shows a cross-sectional view of an exemplary embodiment of a region A shown in FIG. 1.

FIG. 2 shows a cross-sectional view of an exemplary embodiment of region A shown in FIG. 1, and FIG. 3 shows a configuration of a phase retardation layer according to an exemplary embodiment of the present invention.

Referring to FIG. 2, a polarization layer 40 is disposed on a thin film encapsulation layer 30. The polarization layer 40 may be a coated polarization layer disposed directly above the thin film encapsulation layer 30. For example, the polarization layer 40 may be in direct contact with the thin film encapsulation layer 30.

The thin film encapsulation layer 30 has a multi-layered structure in which a first inorganic layer 311, a first phase retardation layer 321, a second inorganic layer 312, a second phase retardation layer 322, a third inorganic layer 313, and a fourth inorganic layer 314 are sequentially stacked. Therefore, the first inorganic layer 311 from among the thin film encapsulation layer 30 is disposed to be most adjacent to the display layer 20. The first inorganic layer 311 may be disposed directly over the blocking layer 212. For example, the first inorganic layer 311 may be in direct contact with the blocking layer 212. In an exemplary embodiment, the thin film encapsulation layer 30 may have total vapor permeation to the extent that moisture may permeate through the thin film encapsulation layer 30 at a rate that is exemplarily equal to or less than about $2 \times 10^{-7}$ g/m²·day.

The first, second, third, and fourth inorganic layers 311, 312, 313, and 314 may include at least one of $SiN_X$, SiON, $Al_2O_3$, and $TiO_2$. Silicon nitride (SiNx) or silicon oxynitride (SiNO) may be deposited using a chemical vapor deposition (CVD) method, and metal oxides such as $Al_2O_3$ or $TiO_2$ may be deposited using an atomic layer deposition (ALD) method. At least two layers of the first, second, third, and fourth inorganic layers 311, 312, 313, and 314 may be made of the same material. For example, the first inorganic layer 311 and the fourth inorganic layer 314 may be made of a material including $Al_2O_3$, and the second inorganic layer 312 and the third inorganic layer 313 may be made of a material including $SiN_X$.

The first phase retardation layer 321 is disposed between the first inorganic layer 311 and the second inorganic layer 312, and the second phase retardation layer 322 is disposed between the second inorganic layer 312 and the third inorganic layer 313. The first phase retardation layer 321 and the second phase retardation layer 322 may be a coated liquid crystal layer. The coated liquid crystal layer may be formed by forming an alignment layer, coating liquid crystal thereon, baking the liquid crystal, cooling the liquid crystal, and curing the liquid crystal so that the alignment layer is coated with the liquid crystal. When the first phase retardation layer 321 and the second phase retardation layer 322 are formed of coated liquid crystal layers, the thin film encapsulation layer 30 may have the total vapor permeation as described above. In an exemplary embodiment, at least one of the first phase retardation layer 321 and the second phase retardation layer 322 may be a non-liquid crystal polymer.

The first phase retardation layer 321 and the second phase retardation layer 322 may have a refractive index that is equal to or less than about 1.5. For example, the refractive index may range between about 1.49 and about 1.5. The first phase retardation layer 321 and the second phase retardation layer 322 may have modulus of about 5.9 GPa, for example. The present invention is not limited thereto. For example, the first phase retardation layer 321 and the second phase retardation layer 322 may have a modulus of about 2.7 to about 4.7 GPa. A difference between the refractive index of the inorganic layers 311, 312, 313, and 314 of the thin film encapsulation layer 30 and the refractive index of the phase retardation layers 321 and 322 may be equal to or less than about ±0.4, so that the change of the optical path of the thin film encapsulation layer 30 may be minimized to reduce the reflection ratio of the thin film encapsulation layer 30. The first phase retardation layer 321 and the second phase retardation layer 322 may be equal to or less than about 3 micrometers thick.

A plasma process may be used to improve the adherence between the inorganic layers 311, 312, and 313 and the phase retardation layers 321 and 322. For example, before the first phase retardation layer 321 is disposed on the first inorganic layer 311, the first inorganic layer 311 is plasma-processed to increase surface roughness of the first inorganic layer 311 so that adherence between the first phase retardation layer 321 and the first inorganic layer 311 may be increased. The present invention is not limited thereto. For example, an adhesive may be used. In an exemplary embodiment, after a ultra-violet (UV) light curable adhesive is coated on the first inorganic layer 311, the adhesive may be cured while or after the first phase retardation layer 321 is formed. The plasma processing or the use of an adhesive may be performed before an inorganic layer is formed and a phase retardation layer is formed thereon, or before a phase retardation layer is generated and an inorganic layer is formed thereon.

The first phase retardation layer 321 and the second phase retardation layer 322 have different optical characteristics. Referring to FIG. 3, the thin film encapsulation layer 30 may include three combinations of a first phase retardation layer 321 and a second phase retardation layer 322.

Regarding the first combination and the second combination, each of the first phase retardation layer 321 and the second phase retardation layer 322 has normal wavelength dispersion. Here, the normal wavelength dispersion represents a characteristic in which a phase difference becomes less as the wavelength of incident light becomes greater. The phase difference may be a polarization shift of a light travelling through the first and second phase retardation layers 321 and 322 from an incident light thereon.

Regarding the first combination, the first phase retardation layer 321 is a positive a-plate (hereinafter, a plate with a phase difference value of $\lambda/2$) functioning as a half-wave plate, and the second phase retardation layer 322 is a positive a-plate (hereinafter, a plate with a phase difference value of $\lambda/4$) functioning as a quarter-wave plate. In this case, the first phase retardation layer 321 and the second phase retardation layer 322 may include a nematic liquid crystal.

Regarding the second combination, the first phase retardation layer 321 is a negative a-plate with a phase difference value of $\lambda/2$, and the second phase retardation layer 322 is a negative a-plate with a phase difference value of $\lambda/4$. In this case, the first phase retardation layer 321 and the second phase retardation layer 322 may include a discotic liquid crystal.

Regarding the third combination, the first phase retardation layer 321 is a positive c-plate, and the second phase retardation layer 322 is a plate with inverse wavelength dispersion and a phase difference value of $\lambda/4$. Here, the inverse wavelength dispersion signifies the characteristic in which a phase difference becomes greater as the wavelength of incident light becomes greater. The first phase retardation layer 321 may exemplarily include a lyotropic liquid crystal. The second phase retardation layer 322 may be a negative a-plate or a positive a-plate. The first phase retardation layer 321 may have an in-plane phase difference of substantially 0.

The first phase retardation layer 321 and the second phase retardation layer 322 of the thin film encapsulation layer 30 serve as a polarization unit together with the polarization layer 40 disposed on the thin film encapsulation layer 30.

A function for a polarization unit to prevent reflection of external light regarding the first and second combinations will now be described. The external light that may be natural light passes through the polarization layer 40 and is transformed into linear-polarization light in a first direction. The first-direction linear-polarization light passes through the second phase retardation layer 322 and is transformed into second-direction linear-polarization light that is perpendicular to the first-direction linear-polarization light, and it passes through the first phase retardation layer 321 and is transformed into right circular polarization light or left circular polarization light. If the right circular polarization light is reflected by an electrode of the display layer 20, the reflected right circular polarization light is transformed into left circular polarization light. If the left circular polarization light is reflected by an electrode of the display layer 20, the reflected left circular polarization light is transformed into right circular polarization light. The reflected left or right circular polarization lights pass through the first phase retardation layer 321 to be transformed into first direction linear-polarization light, and through the second phase retardation layer 322 to be transformed into second direction linear-polarization light. The polarization layer 40 is transmittable to the first direction linear-polarization light only so that the second-direction-linear-polarization light is not allowed to pass through the polarization layer 40. Therefore, the external light provided to the polarization unit and reflected by the display layer 20 is not allowed to pass through the polarization unit. As such, the reflection of external light caused by the display layer 20 may be suppressed.

A function for a polarization unit to prevent reflection of external light regarding the third combination will now be described. External light passes through the polarization layer 40 to be transformed into first-direction-linear-polarization light, and the first-direction-linear-polarization light passes through the second phase retardation layer 322 to be transformed into right circular polarization light or left circular polarization light, which passes through the first phase retardation layer 321. The right circular polarization light or the left circular polarization light is reflected by the display layer 20 to be transformed into left circular polarization light or right circular polarization light of which a polarization direction is exchanged, it passes through the first phase retardation layer 321, and it passes through the second phase retardation layer 322 to be transformed into second-direction-linear-polarization light. The second-direction-linear-polarization light is not allowed to pass through the polarization layer 40 so the reflection of external light by the display layer 20 is prevented by the polarization unit. The first phase retardation layer 321 does not substantially change the linear polarization light or the circular polarization light, but compensates a thickness-direction phase difference of the second phase retardation layer 322.

For example, when the second phase retardation layer 322 with inverse wavelength dispersion is formed without the first phase retardation layer 321 corresponding to a compensation layer, a color shift occurs according to a viewing angle. Further, compared to the case of generating multiple phase retardation layers, coating uniformity is degraded so coating mura visibility may be increased. Regarding the first phase retardation layer 321 that is a positive c-plate, generation of a color shift according to a viewing angle may be prevented by inversely compensating the thickness-direction phase difference caused by the second phase retardation layer 322. For example, when the second phase retardation layer 322 has a positive thickness-direction phase difference, the first phase retardation layer 321 may have a negative thickness direction phase difference, and when the second phase retardation layer 322 has a negative thickness-direction phase difference, the first phase retardation layer 321 may have a positive thickness direction phase difference. The thickness-direction phase difference of the first phase retardation layer 321 may be within about ±50 nm with respect to the thickness-direction phase difference of the second phase retardation layer 322. The thickness-direction phase difference size of the second phase retardation layer 322 may substantially correspond to the thickness-direction phase difference size of the first phase retardation layer 321.

When the thin film encapsulation layer 30 is formed as described above, there is no need to separately provide the first and second phase retardation layers 321 and 322 outside the thin film encapsulation layer 30, thereby reducing the thickness of the display device and omitting the process for separately providing the phase retardation layers. In addition, the first and second phase retardation layers 321 and 322 may function as an organic layer that may be included in the thin film encapsulation layer 30 so the characteristic of preventing permeation of moisture by the thin film encapsulation layer 30 is not deteriorated by the first and second phase retardation layers 321 and 322.

In an exemplary embodiment of the present invention, the thin film encapsulation layer 30 may include the phase retardation layers 321 and 322 as the polarization unit. The polarization layer 40 is disposed over the thin film encapsulation layer 30, separated from the thin film encapsulation layer 30. If the polarization layer 40 is disposed in the thin film encapsulation layer 30 and if the polarization layer 40 is disposed under an inorganic layer of the thin film encapsulation layer 30, external light need to pass through the inorganic layer before reaching the polarization layer 40. In this case, the external light may have a phase difference of about 3 nm or more before reaching the polarization layer 40 and thus a rainbow mura may be seen. According to an exemplary embodiment of the present invention, the external light passes through the polarization layer 40 and then enters the thin film encapsulation layer 30 to suppress the rainbow mura problem.

In FIG. 2, the thin film encapsulation layer 30 includes four inorganic layers 311, 312, 313, and 314 and two phase retardation layers 321 and 322. The present invention is not limited thereto. For example, the thin film encapsulation layer 30 may include greater than or less than four inorganic layers; at least one of the inorganic layers 311, 312, 313 and 314 may be omitted in the thin film encapsulation layer 30; or the thin film encapsulation layer 30 may include at least three phase retardation layers. A plurality of exemplary layer-stacked configurations of a thin film encapsulation layer 30 including a lesser number of inorganic layers than the exemplary embodiment of FIG. 2 will now be described with reference to FIG. 4 to FIG. 10.

FIG. 4, FIG. 5, FIG. 6, FIG. 7, FIG. 8, FIG. 9, and FIG. 10 show cross-sectional views of several exemplary embodiments of a region A shown in FIG. 1.

Referring to FIG. 4 to FIG. 10, a polarization layer 40 is disposed on the thin film encapsulation layer 30. The polarization layer 40 may be a coated polarization layer disposed directly over the thin film encapsulation layer 30. For example, the polarization layer 40 may be in direct contact with the thin film encapsulation layer 30. The thin film encapsulation layer 30 may include a first phase retardation layer 321 and a second phase retardation layer 322, which may correspond to one of the above-described combinations of the first combination, the second combination, and the third combination.

Figure 4:
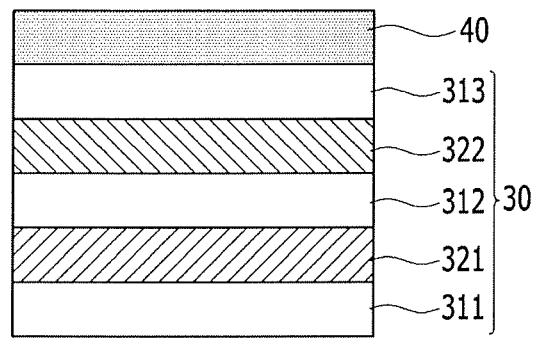
FIG. 4, FIG. 5, FIG. 6, FIG. 7, FIG. 8, FIG. 9, and FIG. 10 show cross-sectional views of several exemplary embodiments of a region A shown in FIG. 1.

Referring to FIG. 4, the thin film encapsulation layer 30 includes a first inorganic layer 311, a first phase retardation layer 321, a second inorganic layer 312, a second phase retardation layer 322, and a third inorganic layer 313 sequentially stacked on each other. The first, second, and third inorganic layers 311, 312, and 313 may include at least one of $SiN_X$, SiON, $Al_2O_3$, and $TiO_2$. The first inorganic layer 311 may be made of a material including $Al_2O_3$, and the second inorganic layer 312 and the third inorganic layer 313 may be made of a material including $SiN_X$. Compared to the exemplary embodiment described with reference to FIG. 2, in the present exemplary embodiment, an inorganic layer is not disposed on the third inorganic layer 313 so that the thickness of the thin film encapsulation layer 30 may be reduced.

Figure 5:
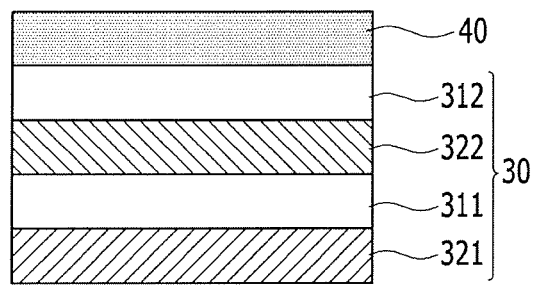

Referring to FIG. 5, the thin film encapsulation layer 30 includes a first phase retardation layer 321, a first inorganic layer 311, a second phase retardation layer 322, and a second inorganic layer 312 which are sequentially stacked on each other. The first phase retardation layer 321 is disposed to be the lowest layer of the thin film encapsulation layer 30 so that the first phase retardation layer 321 may be disposed directly on the functional layer 210. For example, the first phase retardation layer 321 is in direct contact with the functional layer 210. When the first phase retardation layer 321 is disposed to be the lowest layer of the thin film encapsulation layer 30 as described, the blocking layer 212 of the functional layer 210 may be omitted. In this case, the first phase retardation layer 321 may be disposed directly above the capping layer 211. For example, the first phase retardation layer 321 is in direct contact with the capping layer 211. The first inorganic layer 311 and the second inorganic layer 312 may be made of a material including $SiN_X$.

Figure 6:
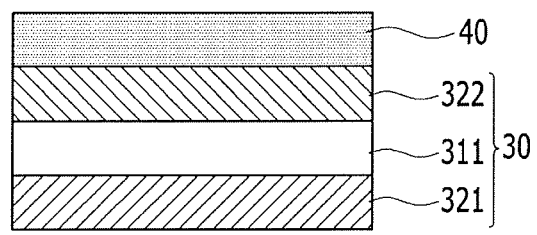

Referring to FIG. 6, the thin film encapsulation layer 30 includes a first phase retardation layer 321, a first inorganic layer 311, and a second phase retardation layer 322 which are sequentially stacked on each other. The second phase retardation layer 322 is disposed to be the highest layer of the thin film encapsulation layer 30 so that the polarization layer 40 may be disposed directly above the second phase retardation layer 322. For example, the polarization layer 40 is in direct contact with the second phase retardation layer 322.

Figure 7:
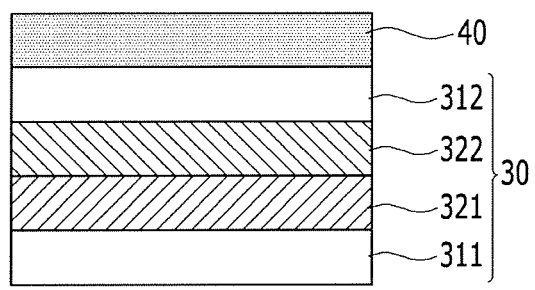
Figure 8:
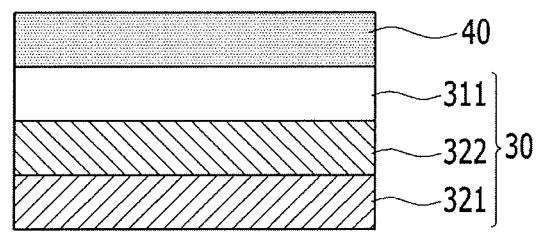
Figure 9:
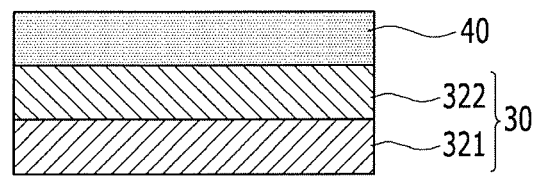

Referring to FIG. 7, FIG. 8, and FIG. 9, the thin film encapsulation layer 30 includes a second phase retardation layer 322 which is disposed directly above a first phase retardation layer 321. For example, the second phase retardation layer 322 is in direct contact with the first phase retardation layer 321. In this case, an inorganic layer is not disposed between the first phase retardation layer 321 and the second phase retardation layer 322, thereby further reducing the thickness of the thin film encapsulation layer 30. According to an exemplary embodiment of FIG. 7, a first inorganic layer 311 is disposed below the first phase retardation layer 321, and a second inorganic layer 312 is disposed above the second phase retardation layer 322. In this case, the first inorganic layer 311 is in direct contact with the first phase retardation layer 321; and the second inorganic layer 312 is in direct contact with the second phase retardation layer 322. The first inorganic layer 311 and the second inorganic layer 312 may be made of a material including $SiN_X$. According to an exemplary embodiment of FIG. 8, an inorganic layer is not disposed below the first phase retardation layer 321, and the first inorganic layer 311 is disposed above the second phase retardation layer 322. According to an exemplary embodiment of FIG. 9, the thin film encapsulation layer 30 includes the first and second phase retardation layers 321 and 322 and no inorganic layer. According to exemplary embodiments of FIG. 8 and FIG. 9, a first phase retardation layer 321 may be disposed directly above the capping layer 211, and according to an exemplary embodiment of FIG. 9, the polarization layer 40 may be disposed directly above the second phase retardation layer 322. The description of "directly above" may include a configuration where two layers are in direct contact each other.

Figure 10:
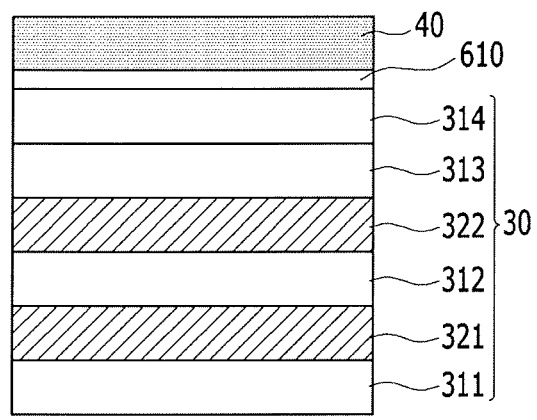

Referring to FIG. 10, differing from the exemplary embodiment of FIG. 2, the polarization layer 40 is attached to the thin film encapsulation layer 30 using an adhesive layer 610 such as a PSA or an OCA. The polarization layer 40 may be a film-type polarization layer, for example, including a PVA. The polarization layer 40 may be a coated polarization layer and may be disposed on the adhesive layer 610. A detailed configuration of the thin film encapsulation layer 30 corresponds to the exemplary embodiment of FIG. 2. The description thereof will be omitted. In FIG. 4 to FIG. 9, the polarization layer 40 has been shown to be disposed directly above the thin film encapsulation layer 30, and in the respective exemplary embodiments, the polarization layer 40 may be attached to the thin film encapsulation layer 30 using an adhesive layer as shown in FIG. 10.

Figure 11:
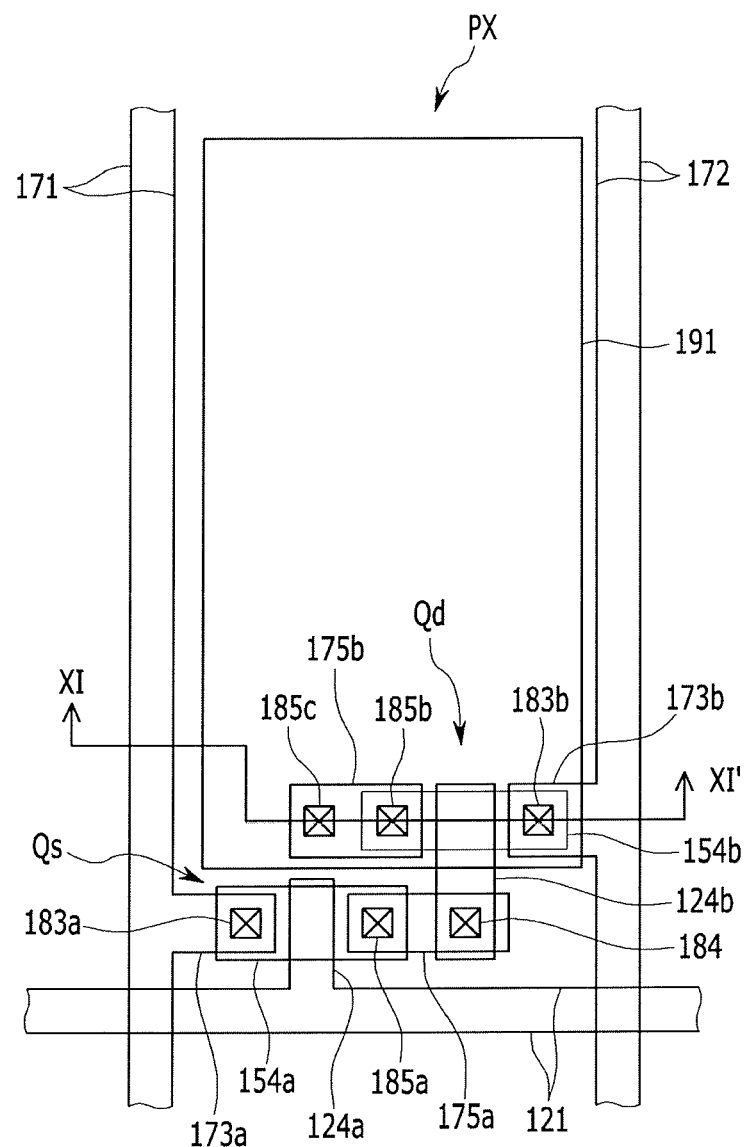
FIG. 11 shows a layout view of a pixel area of a display device according to an exemplary embodiment of the present invention.
Figure 12:
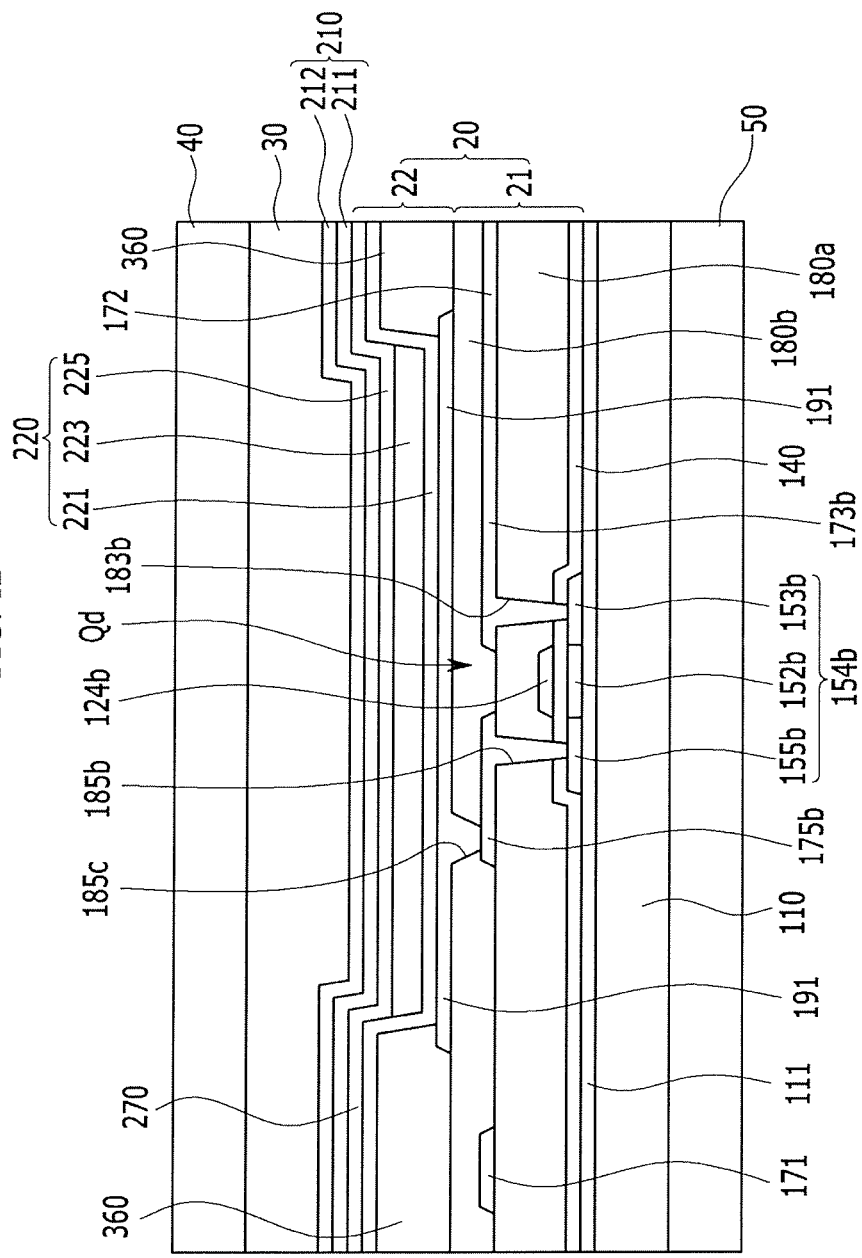
FIG. 12 shows a cross-sectional view of an exemplary embodiment with respect to a line XII-XII' of FIG. 11.

With reference to FIG. 11 and FIG. 12, a display device will now be described with reference to a pixel of the display device according to an exemplary embodiment of the present invention.

FIG. 11 shows a layout view of a pixel area of a display device according to an exemplary embodiment of the present invention, and FIG. 12 shows a cross-sectional view of an exemplary embodiment with respect to a line XII-XII' of FIG. 11.

Referring to FIG. 11 and FIG. 12, the display device includes signal lines 121, 171, and 172 and a pixel PX connected thereto. The signal lines include a gate line 121 for transmitting a gate signal, a data line 171 for transmitting a data signal, and a driving voltage line 172 for transmitting a driving voltage. The pixel PX includes a switching transistor Qs, a driving transistor Qd, and a storage capacitor (not shown), and further includes a light emitting diode including an emission member 220.

Regarding a stacked configuration of the display device, the display device includes a substrate 110 and a plurality of layers disposed thereon. The substrate 110 may be a flexible substrate made of an insulation material such as a polymer film for example, and a passivation layer 50 that may be made of polyethylene terephthalate may be attached to a bottom side of the substrate 110.

A buffer layer 111 for preventing spreading of an impurity that degrades a semiconductor characteristic and permeation of moisture may be generated on the substrate 110. The substrate 110 may be made of a plurality of layers, and the buffer layer 111 may be disposed among a plurality of layers of the substrate 110. For example, the substrate 110 may have a configuration in which the polymer film and the buffer layer are alternately stacked.

A display layer 20 including a driving element layer 21 and an emissive element layer 22 described with reference to FIG. 1 is disposed on the buffer layer 111.

Regarding the driving element layer 21, a first semiconductor 154a and a second semiconductor 154b are formed on the buffer layer 111. The first semiconductor 154a may include a channel region (not shown), and a source region (not shown) and a drain region (not shown) disposed on respective sides of the channel region and doped. The second semiconductor 154b may include a channel region 152b, and a source region 153b and a drain region 155b disposed on respective sides of the channel region 152b and doped. The first semiconductor 154a and the second semiconductor 154b may include polysilicon. The first semiconductor 154a and the second semiconductor 154b may include an oxide semiconductor or amorphous silicon.

A gate insulating layer 140 that may be made of a silicon oxide or a silicon nitride is disposed on the first semiconductor 154a and the second semiconductor 154b. The gate insulating layer 140 may be disposed to be a single layer or multiple layers.

A gate conductor including a gate line 121, a first gate electrode 124a, and a second gate electrode 124b is disposed on the gate insulating layer 140. The first gate electrode 124a may overlap the channel region of the first semiconductor 154a, and the second gate electrode 124b may overlap the channel region 152b of the second semiconductor 154b.

A first passivation layer 180a is disposed on the gate insulating layer 140 and the gate conductor. The first passivation layer 180a and the gate insulating layer 140 include a contact hole 183a overlapping the source region of the first semiconductor 154a, a contact hole 185a overlapping the drain region, a contact hole 183b overlapping the source region 153b of the second semiconductor 154b, and a contact hole 185b overlapping the drain region 155b.

A data conductor including a data line 171, a driving voltage line 172, a first source electrode 173a, a second source electrode 173b, a first drain electrode 175a, and a second drain electrode 175b is formed on the first passivation layer 180a. The first source electrode 173a and the first drain electrode 175a may be connected to the source region and the drain region of the first semiconductor 154a through the contact holes 183a and 185a, respectively. The first drain electrode 175a may be connected to the second gate electrode 124b through a contact hole 184. The second source electrode 173b and the second drain electrode 175b may be connected to the source region 153b and the drain region 155b of the second semiconductor 154b through the contact holes 183b and 185b, respectively.

The first gate electrode 124a, the first source electrode 173a, and the first drain electrode 175a configure a switching transistor Qs together with the first semiconductor 154a, and the second gate electrode 124b, the second source electrode 173b, and the second drain electrode 175b configure a driving transistor Qd together with the second semiconductor 154b. The transistors Qs and Qd may have various configurations as well as the shown configuration.

A second passivation layer 180b that may be made of an organic material and/or an inorganic material such as a silicon oxide or a silicon nitride may be disposed on the data conductor. The second passivation layer 180b may have a flat surface so as to increase emission efficiency of the organic light emitting element to be formed thereon. A contact hole 185c overlapping the second drain electrode 175b may be formed in the second passivation layer 180b.

Regarding the emissive element layer 22, a pixel electrode or a first electrode 191 corresponding to an anode is disposed on the second passivation layer 180b. The first electrode 191 of each pixel is physically and electrically connected to the second drain electrode 175b through the contact hole 185c of the second passivation layer 180b. The first electrode 191 may be made of a reflective conductive material or a semi-reflective conductive material, and it may also be made of a transparent conductive material. The first electrode 191 may be formed to be a single layer or multiple layers.

A pixel definition layer 360 including a plurality of openings for exposing the first electrode 191 may be disposed on the second passivation layer 180b. The openings of the pixel definition layer 360 exposing the first electrode 191 may define respective pixel areas. The pixel definition layer

360 may be omitted. The pixel definition layer may be referred to as a partition wall.

An emission member 220 is disposed on the pixel definition layer 360 and the first electrode 191. The emission member 220 may include a first organic common layer 221, an emission layer 223, and a second organic common layer 225 that are sequentially stacked.

The first organic common layer 221 may include at least one of a hole injection layer HIL and a hole transport layer HTL. When the first organic common layer 221 includes the two layers, the hole injection layer and the hole transport layer may be sequentially stacked. The first organic common layer 221 may be formed on the entire side of the display area in which the pixels are disposed or in the respective pixel areas.

The emission layer 223 may be disposed on the first electrode 191 of the corresponding pixel. The emission layer 223 may be made of an organic material for uniquely expressing light of basic colors including red, green, and blue, and it may have a configuration in which a plurality of organic material layers expressing different colors are stacked. The emission layer 223 may include a white-color emission layer for expressing the white color. Part of the emission layer 223 may be disposed to overlap the driving transistor Qd.

The second organic common layer 225 may include at least one of an electron transport layer ETL and an electron injection layer EIL, and when it includes them both, the electron transport layer and the electron injection layer may be sequentially stacked.

A common electrode or a second electrode 270 corresponding to a cathode is formed on the emission member 220. The second electrode 270 may be made of a transparent conductive material such as an ITO or an IZO, or it may be formed by stacking thin metals such as calcium (Ca), barium (Ba), magnesium (Mg), aluminum (Al), or silver (Ag) to have photo-transmittance. The first electrode 191, the emission member 220, and the second electrode 270 of the pixel configure a light emitting diode.

A functional layer 210 is disposed on the second electrode 270. The functional layer 210 includes a capping layer 211 and a blocking layer 212, and the blocking layer 212 may be omitted. A thin film encapsulation layer 30 that may have the above-described various configurations is disposed on the functional layer 210, and a polarization layer 40 is disposed on the thin film encapsulation layer 30.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display device comprising:
    a substrate;
    a light emitting diode disposed on the substrate;
    a thin film encapsulation layer covering the light emitting diode;
    at least one functional layer disposed between the light emitting diode and the thin film encapsulation layer; and
    a polarization layer disposed on the thin film encapsulation layer,
    wherein the thin film encapsulation layer includes a plurality of phase retardation layers, wherein the plurality of phase retardation layers include a first phase retardation layer disposed on the light emitting diode, and a second phase retardation layer disposed between the first phase retardation layer and the polarization layer.

2. The display device of claim 1, wherein each of the plurality of phase retardation layers includes a coated liquid crystal layer.

3. The display device of claim 1, wherein each of the first phase retardation layer and the second phase retardation layer has normal wavelength dispersion.

4. The display device of claim 3, wherein
    the first phase retardation layer is a positive a-plate with a $\lambda/2$ phase difference value, and
    the second phase retardation layer is a positive a-plate with a $\lambda/4$ phase difference value.

5. The display device of claim 4, wherein each of the first phase retardation layer and the second phase retardation layer includes a nematic liquid crystal.

6. The display device of claim 3, wherein
    the first phase retardation layer is a negative a-plate with a $\lambda/2$ phase difference value, and
    the second phase retardation layer is a negative a-plate with a $\lambda/4$ phase difference value.

7. The display device of claim 6, wherein the first phase retardation layer and the second phase retardation layer respectively include a discotic liquid crystal.

8. The display device, of claim 1, wherein
    the first phase retardation layer is a positive c-plate, and
    the second phase retardation layer has an inverse wavelength dispersion and a $\lambda/4$ phase difference value.

9. The display device of claim 1, wherein the first phase retardation layer and the second phase retardation layer respectively have a refractive index of about 1.5 or less and a modulus of about 5.9 GPa.

10. The display device of claim 1, wherein the functional layer includes a capping layer disposed on the light emitting diode.

11. The display device of claim 10, wherein the functional layer further includes a blocking layer disposed on the capping layer.

12. The display device of claim 11, wherein the thin film encapsulation layer further includes an inorganic layer disposed between the blocking layer and the first phase retardation layer.

13. The display device of claim 11, wherein the first phase retardation layer is disposed directly on the capping layer.

14. The display device of claim 1, wherein the thin film encapsulation layer further includes an inorganic layer disposed between the first phase retardation layer and the second phase retardation layer.

15. The display device of claim 1, wherein the thin film encapsulation layer further includes an inorganic layer disposed between the second phase retardation layer and the polarization layer.

16. The display device of claim 1, wherein the second phase retardation layer is in direct contact with the first phase retardation layer.

17. The display device of claim 1, further comprising
    an adhesive layer disposed between the thin film encapsulation layer and the polarization layer.

* * * * *